(12) United States Patent
Withers et al.

(10) Patent No.: US 6,842,004 B2
(45) Date of Patent: Jan. 11, 2005

(54) PLANAR NMR COILS WITH LOCALIZED FIELD-GENERATING AND CAPACITIVE ELEMENTS

(75) Inventors: Richard S. Withers, Sunnyvale, CA (US); Robert E. Nast, Saratoga, CA (US)

(73) Assignee: Bruker Biospin Corp., Billerica, MA (US)

( * ) Notice: Subject to any disclaimer, the term of this patent is extended or adjusted under 35 U.S.C. 154(b) by 0 days.

(21) Appl. No.: 10/424,687

(22) Filed: Apr. 28, 2003

(65) Prior Publication Data

US 2004/0032262 A1 Feb. 19, 2004

Related U.S. Application Data

(63) Continuation-in-part of application No. 09/803,199, filed on Mar. 9, 2001, now Pat. No. 6,556,013.

(51) Int. Cl.$^7$ ................................................ G01V 3/00
(52) U.S. Cl. ...................................... 324/318; 324/322
(58) Field of Search ................................. 324/318, 322, 324/309, 307, 319, 320; 505/844, 866; 526/60, 59; 432/37; 600/407

(56) References Cited

U.S. PATENT DOCUMENTS

| | | | | |
|---|---|---|---|---|
| 4,710,550 A | * | 12/1987 | Kranbuehl | 526/60 |
| 4,723,908 A | * | 2/1988 | Kranbuehl | 432/37 |
| 5,258,710 A | * | 11/1993 | Black et al. | 324/309 |
| 5,276,398 A | * | 1/1994 | Withers et al. | 324/318 |
| 5,565,778 A | * | 10/1996 | Brey et al. | 324/318 |
| 5,585,723 A | * | 12/1996 | Withers | 324/318 |
| 5,594,342 A | * | 1/1997 | Brey et al. | 324/322 |
| 5,619,140 A | | 4/1997 | Brey et al. | |
| 6,377,047 B1 | * | 4/2002 | Wong et al. | 324/318 |
| 6,556,013 B2 | * | 4/2003 | Withers | 324/322 |
| 6,590,394 B2 | * | 7/2003 | Wong et al. | 324/318 |
| 2004/0032262 A1 | * | 2/2004 | Withers et al. | 324/318 |

* cited by examiner

*Primary Examiner*—Diego Gutierrez
*Assistant Examiner*—Tiffany A. Fetzner
(74) *Attorney, Agent, or Firm*—Kudirka & Jobse, LLP

(57) ABSTRACT

Improved superconducting coils for a nuclear magnetic resonance probe use capacitive elements that are located in regions further from an active sample volume than magnetic field generating elements to which they are electrically connected. The sample volume is a substantially oblong shape, and the magnetic field generating elements run substantially parallel to the major axis of the shape, while the capacitor elements run perpendicular to the major axis. Gaps between the capacitor elements, and the width of the elements themselves, may increase toward the outside of the coil to minimize electrical discharge. The variation may be according to a monotonic, possibly linear, function. Discharge may also be minimized by using a dielectric cover that, together with a coil substrate, encloses the coil.

36 Claims, 13 Drawing Sheets

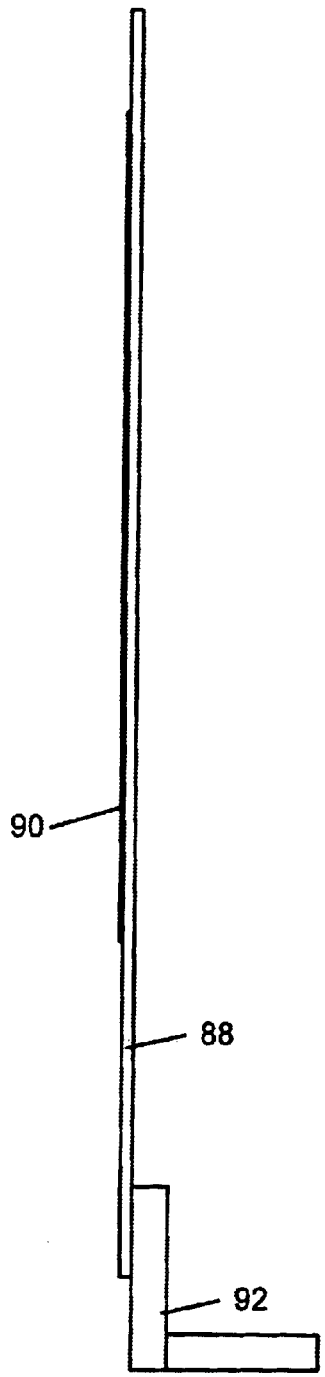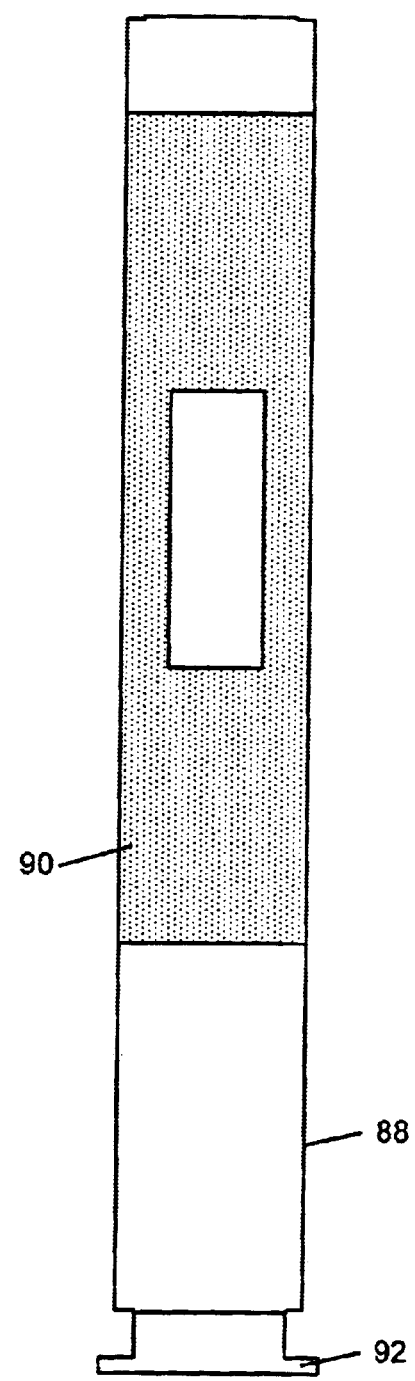
*Figure 7A*  *Figure 7B*

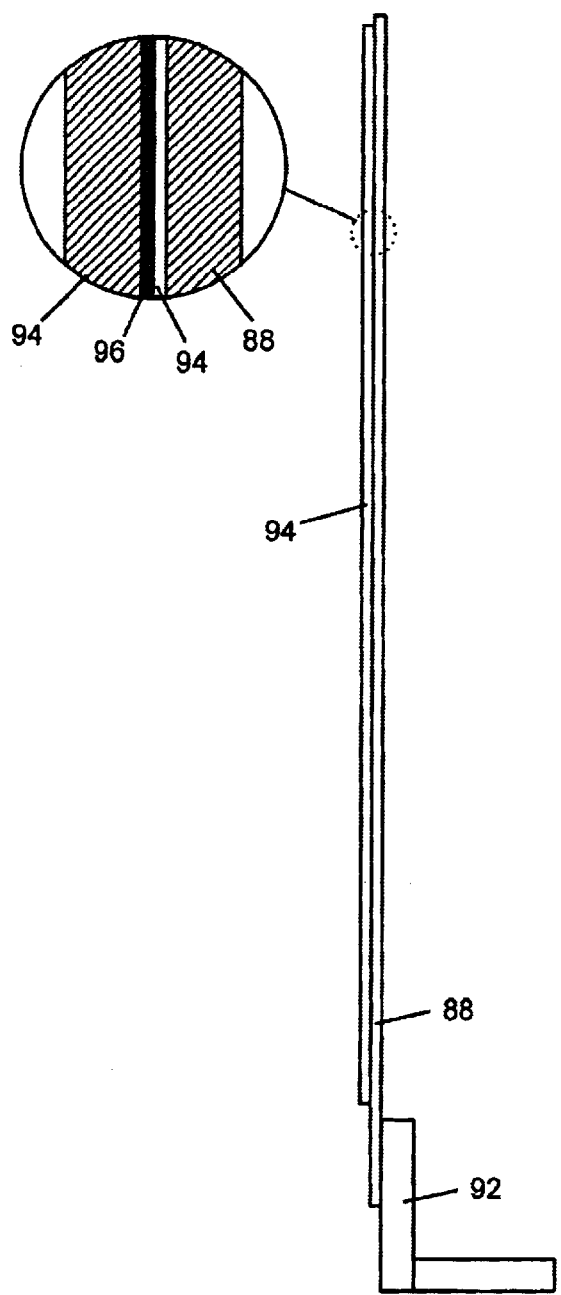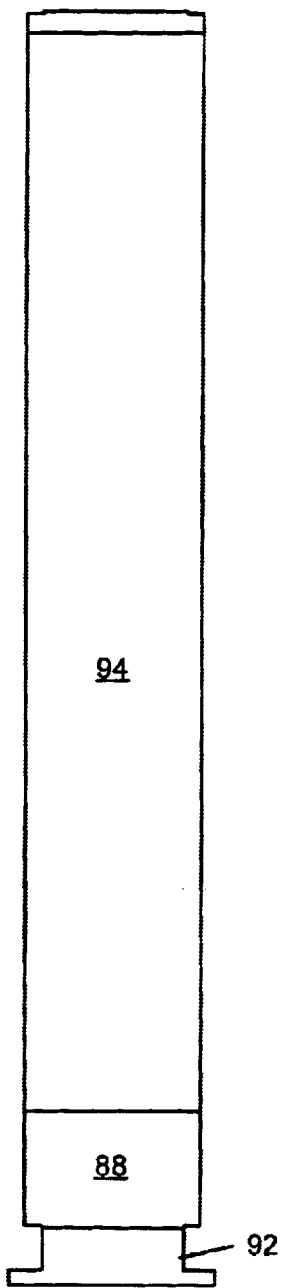
*Figure 8A*     *Figure 8B*

PLANAR NMR COILS WITH LOCALIZED FIELD-GENERATING AND CAPACITIVE ELEMENTS

CROSS-REFERENCE TO RELATED APPLICATION

This application is a continuation-in-part of U.S. patent application Ser. No. 09/803,199, filed on Mar. 9, 2001 now U.S. Pat. No. 6,556,013.

BACKGROUND OF THE INVENTION

1. Field of the Invention

This invention relates to RF probes for nuclear magnetic resonance (NMR) spectroscopy and microscopy and, more particularly, to resonant coils for the transmission and reception of NMR signals.

2. Description of Related Art

In an NMR spectrometer probe, a sample is placed in a static magnetic field which causes atomic nuclei within the sample to align in the direction of the field. Transmit and receive coils, which may be combined in a single coil or set of coils, are placed in the probe positioned close to the sample. The transmit coils apply an RF magnetic field orthogonal to the direction of the static magnetic field, perturbing the alignment of the nuclei. The transmit signal is then turned off, and the resonant RF signal of the sample is detected by the receiver coil. The sensitivity of the spectrometer depends on a number of factors, including the strength of the static field, the closeness of the coupling between the RF coils and the sample, and the resistance of the RF coil.

Currently, most commercial NMR spectrometers use RF coils made of a normal metal, such as copper, or a combination of normal metals. Much research has been devoted to the design of coils for maximum sensitivity. For example, to achieve close coupling, coils have been made that include configurations such as solenoids, saddle coils and birdcage coils, all of which have high filling factors. In each case, however, the resistance of these coil materials has limited their sensitivity. Cooling of RF coils to reduce their resistance has been suggested. However, even when cooled, the sensitivity of conventional normal-metal coils is still limited by their resistance.

The use of superconductors in place of conventional normal metal for RF coils in NMR spectrometers has previously been suggested. For example, U.S. Pat. No. 5,247,256 to Marek describes several RF receiver coil arrangements for NMR spectrometers using thin-film superconducting coils.

The advantage to be obtained with high temperature superconductor ("HTS") coils is significant. HTS coils have very low resistance and are operable in high magnetic fields at temperatures achievable with currently available refrigeration systems (above 20K). The quality factor, Q, of the coil is a useful measure of the coil's efficiency. $Q=\omega L/R$, where $\omega/2\pi$ is the resonant frequency, L is the inductance and R is the resistance of the coil. Well-designed room temperature NMR coils achieve matched Qs of about 250. Because of the extremely low resistance of HTS coils, coils with matched Qs of 10,000 or more are possible. However, this advantage can only be realized if the other factors necessary for a superior NMR probe are met, such as a reasonable filling factor and high RF and DC field homogeneity.

In addition to Marek, others have reported thin-film superconductor RF coils for magnetic resonance applications. For example, U.S. Pat. No. 5,276,398 to Withers, et al. describes a thin-film HTS probe for magnetic resonance imaging. It discloses a thin-film coil having inductors in a spiral of greater than one turn and capacitive elements extending from the inductors. Withers thus provides a thin film distributed capacitance probe coil. However, magnetic field disturbances by the coil can be a problem, and the current carrying capacity of the coil is somewhat limited.

U.S. Pat. No. 5,258,710 to Black also describes HTS thin-film receiver coils for NMR microscopy. Black discloses several embodiments, including split ring, solenoidal, saddle coils, birdcage coils and coils described as "Helmholtz pairs." Black's embodiments are essentially conventional NMR coil designs and do not address the unique characteristics of high-temperature superconductor materials. Superconductors are very attractive for use in these coils. They have very low resistance at radio frequencies and, hence, produce little noise. Even so, to obtain high signal-to-noise ratio (SNR), the coils must be as close as possible to the sample. Unfortunately, this means that any magnetization of the coil material will affect the uniformity of the DC polarizing field ($B_0$) over the sample volume, producing a distortion of the spectral line shape and degradation of SNR. Because superconductors are strongly diamagnetic, line-shape distortions could be severe.

Thin-film HTS coils offer design and processing challenges not present with normal-metal coils. First, high-temperature superconductors are perovskite ceramics, which require a well-oriented crystal structure for optimum performance. Such orientation is extremely difficult to achieve on a nonplanar substrate. Generally, such coils are preferably deposited epitaxially on a planar substrate. This makes the achievement of a high filling factor more challenging. It is also desirable for the coil to be deposited in a single layer of superconducting film, without crossovers. Second, the coil must be able to handle relatively high currents while producing a uniform magnetic field and avoiding distortion of the $B_0$ field of the magnet. Even when HTS films are deposited epitaxially on a planar substrate, crystalline defects inevitably occur. This can lead to burn out of fine features of a coil exposed to high currents. Third, it is well known in the art that forming ohmic contacts between an HTS and a normal metal is difficult and generally leads to parasitic losses at the point of contact. To the extent that a normal metal is used in the coil, resistive losses in the metal elements would lessen the advantages gained from the use of the HTS. Thus, an ideal probe should avoid normal-metal conductors in series with the HTS.

U.S. Pat. No. 5,565,778 to Brey, et al. discloses a number of different configurations of a probe for NMR spectroscopy. Each of these configurations uses a coil having conductors mounted on a planar substrate. The conductors are arranged such that the coil includes at least one interdigital capacitor. That is, interleaved conductors having a constant spacing between them are located on the substrate. Each conductor surrounds a central sample location and lies closely adjacent to at least one other conductor. None of the conductors completely surrounds the sample location on its own, but the conductors are in an alternating arrangement such that adjacent conductors have respective breaks in their conductive paths at different radial positions relative to the sample location. This results in a capacitive configuration that forms a coil surrounding the sample location.

SUMMARY OF THE INVENTION

In accordance with the present invention, a magnetic resonance radio frequency resonator is provided that makes use of a particularly efficient coil configuration. The resonator generates a radio frequency magnetic field in an active sample volume, and includes a planar substrate on which is deposited a conductive material. In a preferred embodiment, the conductive material is superconducting, and is preferably a high-temperature superconductor. It is deposited on the dielectric substrate so as to form a plurality of nested current carrying loops, each of which has magnetic field generating elements and interdigital capacitor elements. These elements are arranged to form a substantially closed geometric path surrounding an inner region that lies adjacent to the active volume, and that is essentially oblong in shape. That is, the shape is longer along a major axis than it is along a minor axis perpendicular to the major axis. In the present invention, most or all of the capacitor elements are located in the current carrying loop farther from a center of the oblong shape than the magnetic field generating elements.

In the preferred embodiment, the magnetic field generating elements run substantially parallel to the major axis of the oblong shape. In contrast, the capacitor elements run perpendicular to the major axis. The capacitor elements comprise conducting fingers that are separated by non-conducting gaps. In one embodiment, the magnetic field generating elements vary in length relative to their distance from a center of the oblong shape. Likewise, the capacitor elements may also have different lengths relative to their distance from the center of the oblong shape. Typically, this would result from the electrical connection between individual magnetic field generating elements and their corresponding capacitor elements, which results in the outer elements being longer than the inner ones. Such an arrangement may therefore result in an overall space occupied by the magnetic field generating elements being essentially trapezoidal in shape.

The connection between the magnetic field generating elements and the capacitor elements may vary. In one embodiment, each magnetic field generating element is connected to a plurality of capacitor elements, while in another embodiment, each capacitor element is connected to a plurality of magnetic field generating elements. The total number of capacitors formed by the loops may also vary from one embodiment to another, typically depending on the necessary resonant frequency. The capacitors are arranged in series with each other and with the magnetic field generating elements, and may total, for example, two or four. One embodiment, however, uses just a single capacitor formed by the capacitor elements. A variation of the present invention that is particularly useful for a one-capacitor coil makes use of sub-coils, each of which incorporates a plurality of the magnetic field generating elements and the interdigital capacitor elements. Preferably, the capacitor elements in such an embodiment would be located to both sides of the minor axis of the coil. This provides the coil with a good degree of symmetry. The location of capacitor elements may alternate between sub-coils, such that the capacitor elements of a first sub-coil are located to the opposite side of the oblong shape from the capacitor elements of any sub-coil immediately adjacent to it. Finally, it may be desirable to use isolated conductive segments within the resonator to occupy what would be otherwise unoccupied space. These isolated segments are not electrically connected to the current carrying loops, but serve to assist in the exclusion of RF magnetic fields from the coil.

It may also be desirable to minimize coil damage from electrical discharge. Such electrical discharge may result from the fact that a relatively high amount of RF flux builds up in the outermost finger pairs of the capacitor elements, as opposed to the innermost or central finger regions. In one embodiment of the invention, this is accomplished by having a graded spacing in the gaps between the capacitor elements. In particular, the interdigital capacitor elements located close to the inner region of the coil, adjacent to the sample volume, have non-conducting gaps between them that are narrower than the gaps that separate the capacitor elements located further from the inner region. This helps to compensate for the difference in RF flux across the coil, so that an average RF electric field charge is approximately equal for each of the gaps between the interdigital capacitor elements. The gap width may change monotonically across the coil and the change may be linear. In addition, the width of the interdigital capacitor elements themselves may also be graded, such that those close to the inner region are narrower than interdigital capacitor elements further from the inner region. Like the gap widths, the capacitor element widths may vary according to a function that may monotonic, and that may also be linear.

In another embodiment of the invention, electrical discharge is controlled by using a dielectric cover that is located to the side of the conductive material opposite the planar substrate. The cover, together with the dielectric substrate, encloses the conductive material of the coil, thereby minimizing the chance of discharge. The cover may be fastened to the substrate with an adhesive, for example, a fluoropolymer film. The substrate and the cover may also be made of the same material, ensuring a thermal-expansion match and a dielectric breakdown field in the cover that is the same as that of the substrate. Although use of the cover may result in a lowering of the resonator frequency, it may be possible to compensate by trimming the coil, for example, with a laser.

BRIEF DESCRIPTION OF THE DRAWINGS

FIGS. 7A and 7B are side and front views, respectively, of a coil apparatus that has no cover protecting it.

FIGS. 8A and 8B are side and front view, respectively, of a coil apparatus that has a cover protecting it.

DETAILED DESCRIPTION

Figure 1:
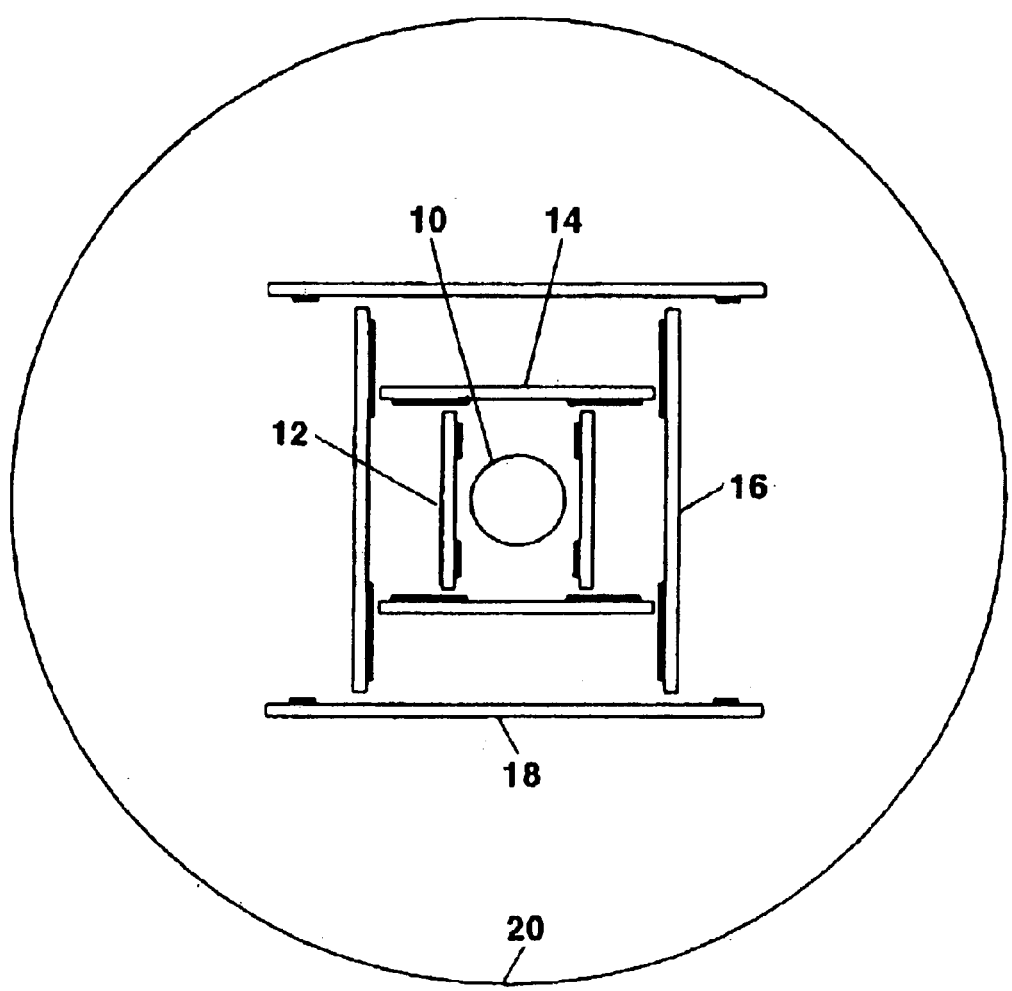
FIG. 1 is a schematic cross sectional view of a triple resonance superconducting probe for NMR spectroscopy.

A possible use for an NMR probe coil according to the present invention is shown in FIG. 1. The figure is shown in cross section, and depicts four sets of coil pairs 12, 14, 16, 18 surrounding a sample volume 10. The configuration shown may be referred to as a "triple-resonance" probe and may be used, for example, for direct observation of $^1$H (coil pair 12), decoupling of $^{13}$C and $^{15}$N (coil pairs 14 and 16) and $^2$H field lock (coil pair 18). Also shown is an RF shield 20, as is known in the art.

In the figure, the direction of the static magnetic field (i.e., the "z-direction") is perpendicular to the plane of the page. Therefore, each of the coils has a finite, but negligible, thickness perpendicular to the z-direction, and resides primarily in a plane parallel to the z-direction. The planes in which the two coils of a given pair reside are parallel to each other, with the sample volume 10 between them. The following are several embodiments of such coils according to the present invention.

Figure 2:
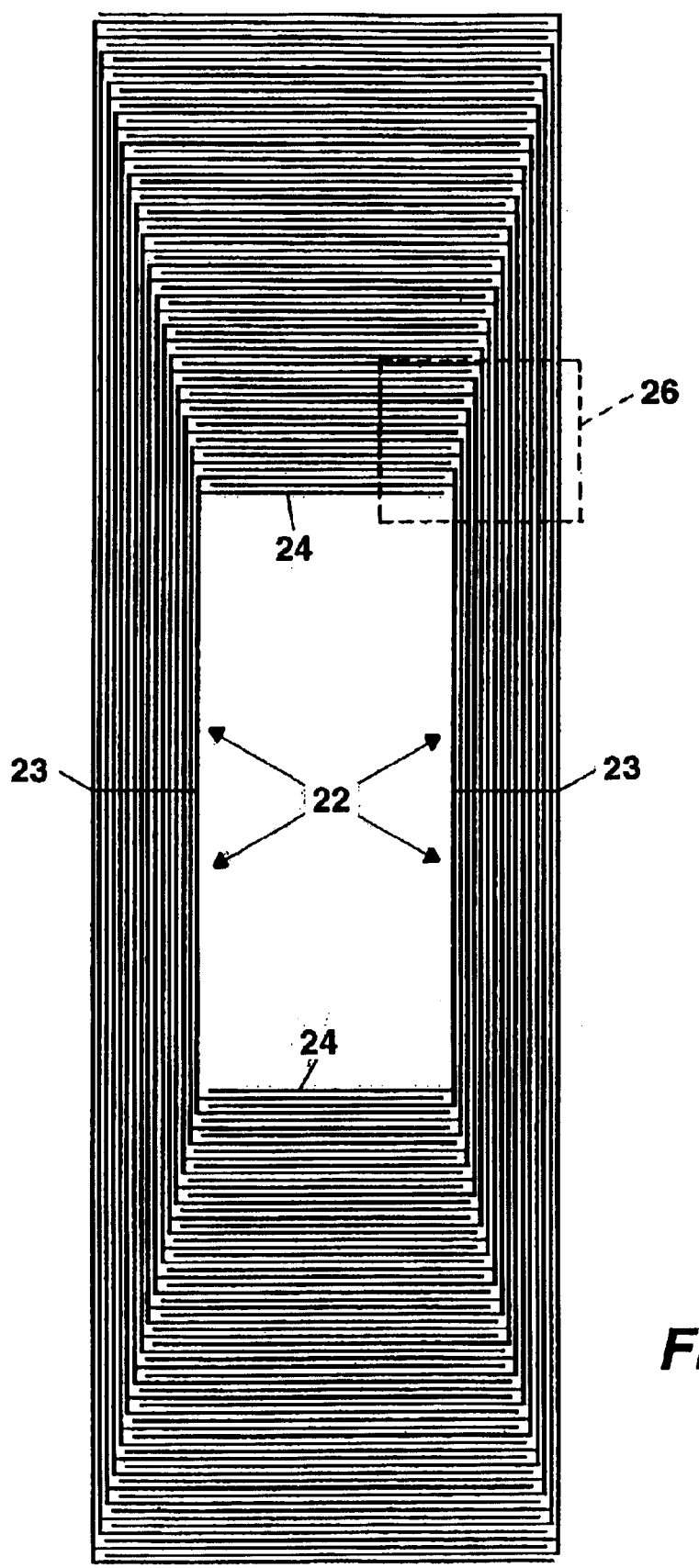
FIG. 2 is a schematic front view of the conductor distribution for a superconducting coil for a superconducting NMR probe according to the present invention.

Shown in FIG. 2 is a schematic view of a first coil embodiment. The view is schematic partly in that it is shown with conductors at an exaggerated scale. That is, in order to depict clearly the configuration of the coil conductors, they are shown much thicker in the drawing figures, and with a correspondingly lower number of conductors per coil. In the coil of FIG. 2, two interdigital capacitors are used, one above the active sample volume and one below it. The capacitors are in series, and consist of horizontal conductors 24, which are also referred to herein as "fingers." The capacitors are electrically connected to vertical elements 22. All conductors of the coil are a high-temperature superconducting material, and are mounted on an appropriate substrate, such as sapphire. The crystal substrate is epitaxially grown and, as known in the art, the HTS film is epitaxially grown on the crystalline substrate, which is chosen for having a lattice spacing that is appropriate for the HTS material. The vertical conductors are straight, and of uniform width. They are separated from one another by only enough of a gap to suppress the magnetization of the superconducting film. Each of the vertical elements 22 is connected to horizontal conductors 24 at the top and/or bottom of the coil. The vertical elements on each side of the coil are also electrically connected to one another by optional conductive nodes 23, also shown in FIG. 3.

In this embodiment of the invention, as in each of the other embodiments, the capacitors are located at the "top" and "bottom" of the coil. Sample containers tend to be oblong in shape, that is, longer in one direction than in a perpendicular direction. Therefore, coils are typically also oblong, and can be described relative to a major and a minor axis. The major axis extends through the center of the sample region along the longer dimension of the coil, while the minor axis extends through the center of the sample region along the shorter dimension of the coil. Thus, in this context, the "top" and "bottom" of the coil are those coil portions that intersect the major coil axis. Since the conductors along the sides of the coil are closer to the sample volume, the magnetic field that they generate has a stronger influence on the sample than it would if the same conductors were located in the top and bottom of the coil, which are further away. Thus, in the present invention, the capacitors are segregated to the top and bottom of the coil, and the vertical elements along the coil sides are used as the primary RF magnetic field generating components. This arrangement retains the benefit provided by the capacitors, while keeping them away from the sides of the coil, where they would otherwise limit the magnetic field generating capacity of the vertical elements.

As shown in FIG. 2, the horizontal conductors 24 are interleaved with one another at the top and the bottom of the coil to make up the capacitors of the coil. The connection between the vertical elements and the horizontal elements depends on the particular application. For example, for some coils, particularly those of higher resonant frequency, each vertical element 22 may be connected to only half of the fingerlets that make up one finger in a capacitor.

Figure 2A:
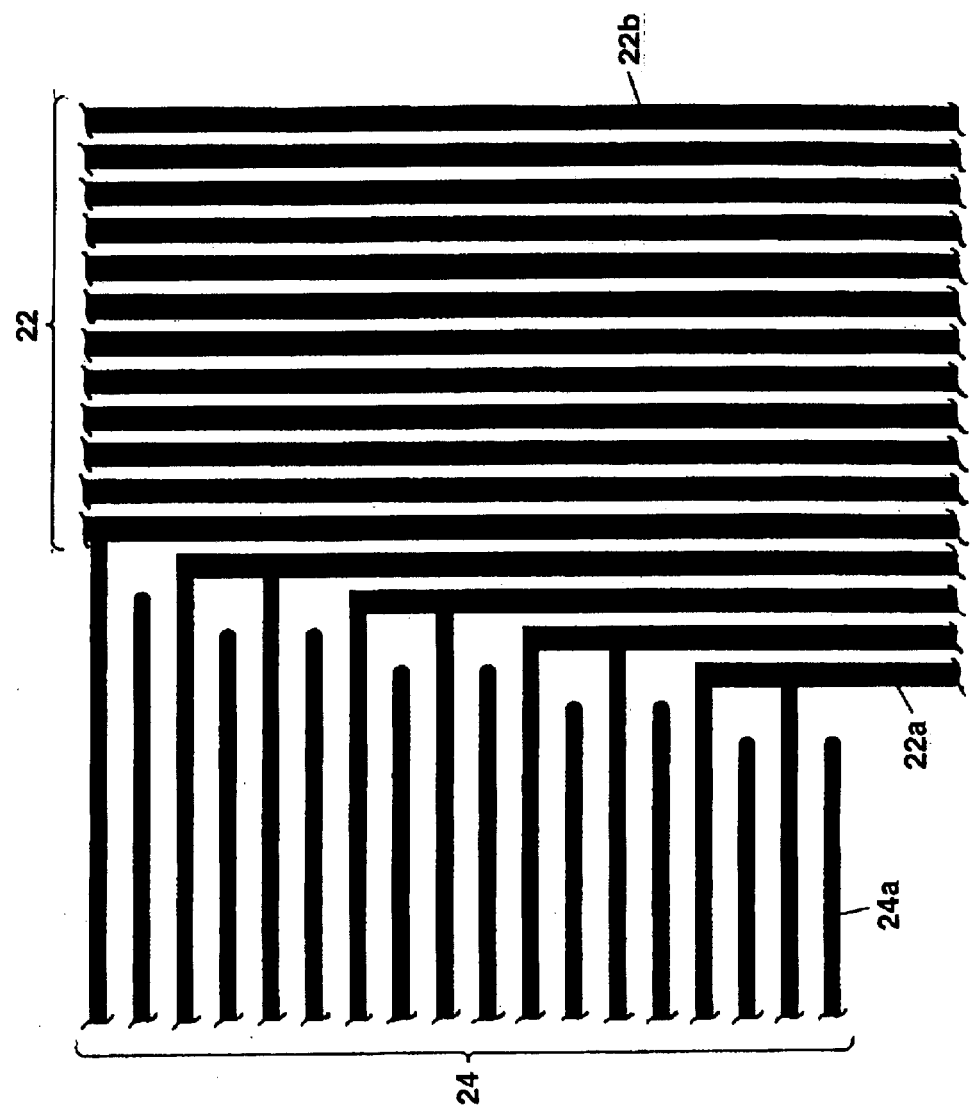
FIG. 2A is an enlarged view of a section of the coil of FIG. 2.

In the embodiment of FIG. 2, each of the vertical conductors 22 is connected to two horizontal elements 24. This is shown more clearly in FIG. 2A, which is an enlarged view of the region 26 identified in FIG. 2. As shown, each pair of fingers that extend from a given vertical conductor 22 surround one of the fingers from the other side of the coil, thus creating a capacitive interleaving of the conductors from the two sides of the coil. In the embodiments of FIGS. 2 and 2A, the length of the fingers increases away from the center of the coil. As shown, the vertical conductors of the coil are necessarily different distances from the center of the coil, and so each contacts its respective fingers further from the major axis of the coil. By extending the vertical conductors only as far as they need go to contact the horizontal elements, additional room is provided into which the fingers may be extended. Thus, as shown, the capacitors of the coil have an overall trapezoidal shape. This geometry helps to maximize the capacitive connection between the two sides of the coil, while maintaining good symmetry across the coil.

As shown in FIGS. 2 and 2A, each capacitor conductor is connected to the vertical conductor array on one side of the coil, and lies adjacent to at least one conductor that is connected to the conductor array on the opposite side of the coil. Except for a finite, but negligible, thickness of the conductors, the coil is located in the plane of the drawing page. As shown in the figures, the conductors in the vertical conductor array are straight and of uniform width. As mentioned above, the vertical conductors 22 are separated from one another by a small amount (a "gaplet") so as to suppress the magnetization effects that would otherwise result from the superconducting material. However, by maximizing the width of the vertical elements, the amount of current that may be passed through the coil is also maximized, providing for the strongest possible field. In contrast to the vertical elements 22, the fingers 24 can be thinner and further spaced apart. The separation between the fingers is maximized to reduce the electric field generated between adjacent fingers, while allowing for the same voltage drop as if they were closer together. Moreover, the gap between adjacent fingers can be kept constant throughout the coil so that the peak electric field is approximately the same between all of the different adjacent capacitor fingers. In this way, the breakdown voltage of the coil is maximized. As shown, the ends of the fingers are also curved to minimize the risk of electrostatic discharge. Preferably, the curvature is such that the ends of the fingers approximate a semicircle. In another embodiment, the gaps between the fingers in the more outer parts of the capacitor are made larger, thereby increasing the breakdown voltage in the outer current loops, which are subjected to greater induced voltages.

By carefully maintaining the dimensions of the capacitor components and the vertical conductors, consistency is achieved across the entire coil. The current flowing through each vertical element 22 is uniform along its length, since it is not part of any capacitor in this region, and there is no capacitive transfer of current (except for negligible parasitic effects). Each of the vertical elements (except for the innermost and outermost elements) also carries approximately the same current density, since each is connected to the same value of capacitance, and has approximately the same induced voltage. However, there is a slight increase in the respective induced voltages toward the outer elements of the array. This effect may be alleviated by providing a larger gap between the fingers at the edges of the capacitor and their adjacent neighboring fingers. For example, in the embodiment of FIG. 2A, the uppermost finger (not shown) may be located, respectively, a distance from the next adjacent finger that is greater than the separation between the other fingers 24, such as the finger 24a and the next adjacent finger. This reduces the capacitance in these outer and inner fingers, and results in a nearly equal current in all vertical elements 22. This, in turn, allows for the peak electric field to be constant through all the various gaps between the capacitor fingers, including those on the edges of the capacitor, helping to ensure that the breakdown voltage of the coil is maximized. In an alternative embodiment, a gradation is introduced to the vertical conductors 22, with the outermost conductors being the widest. In this embodiment, there is a gradual increase in the width of the vertical conductors proceeding from the innermost to the outermost conductor on each side of the coil. Thus, in the arrangement of FIG. 2A, this alternative embodiment would provide that the conductor 22a was the thinnest and conductor 22b was the thickest. This, too, ensures a more consistent current density across all the elements of the conductor array, but does not increase the breakdown voltage.

In the embodiment of the invention shown in FIG. 2, the coil has two interdigital capacitors in series, one above the sample volume and one below it. In a probe, two such coils would be used as a pair, one to either side of the sample volume. A coil pair with such a configuration has been found to be particularly useful for operation at a frequency of 125.76 MHz, that of $^{13}C$ in an 11.7-Tesla magnet. The primary function of this coil pair is to excite, or "decouple," the carbon nuclei in a typical sample tube having a 2.5 mm outer diameter. A secondary function of the coil pair is to detect the resonant RF signal of these nuclei.

The following is an example of the possible parameters for a coil such as is shown in FIGS. 2 and 2A. The example coil may have an outer width of 10,250 $\mu$m and an inner width of 5,480 $\mu$m, with an outer length of 36,000 $\mu$m and an inner length of 13,000 $\mu$m. This example coil has ninety 21-$\mu$m-wide vertical elements on each side, with each vertical element connected to two 11-$\mu$m-wide capacitor fingers, the gap between adjacent capacitor fingers being 21 $\mu$m.

Figure 3:
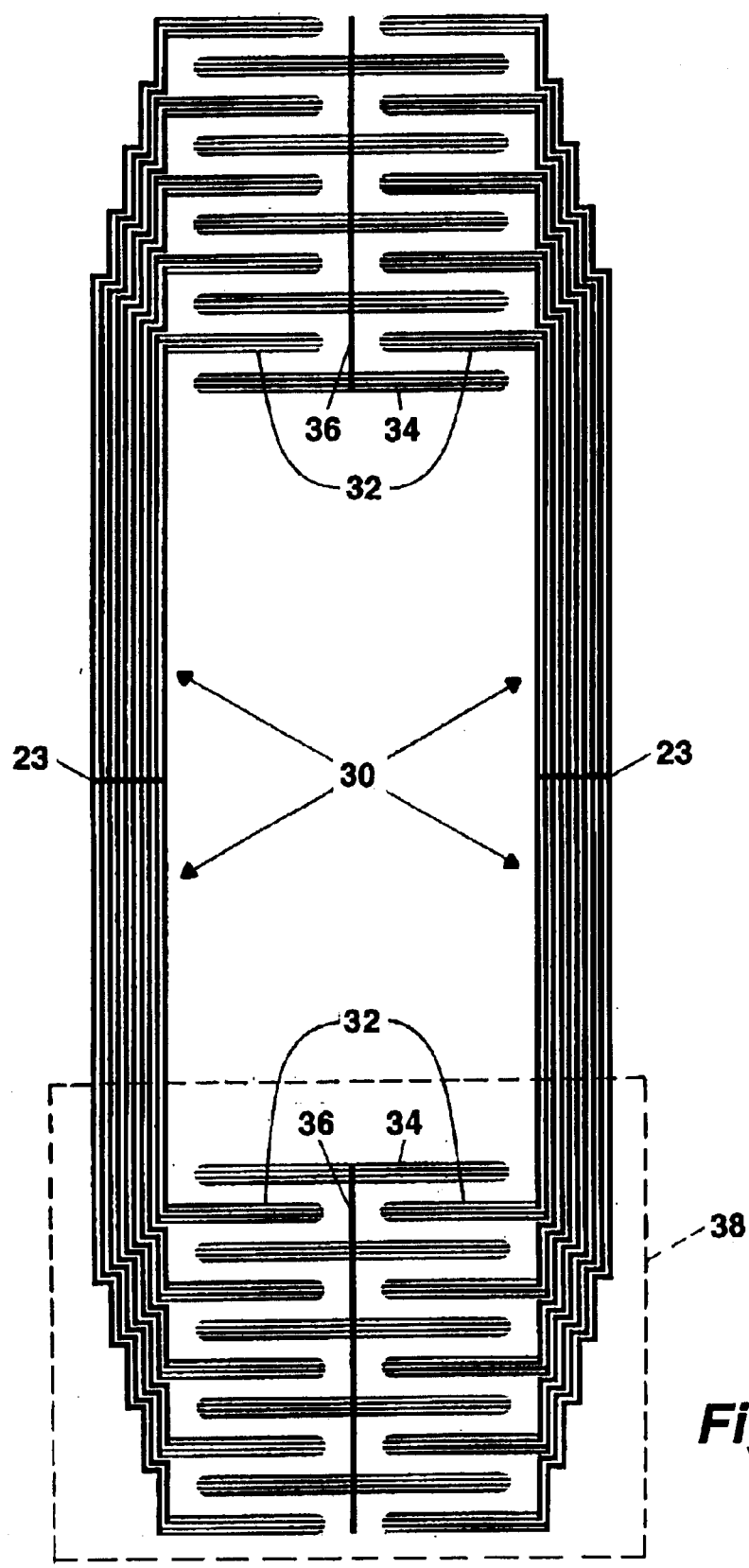
FIG. 3 is a schematic front view of the conductor distribution of a high frequency coil for an NMR probe according to the present invention.
Figure 3A:
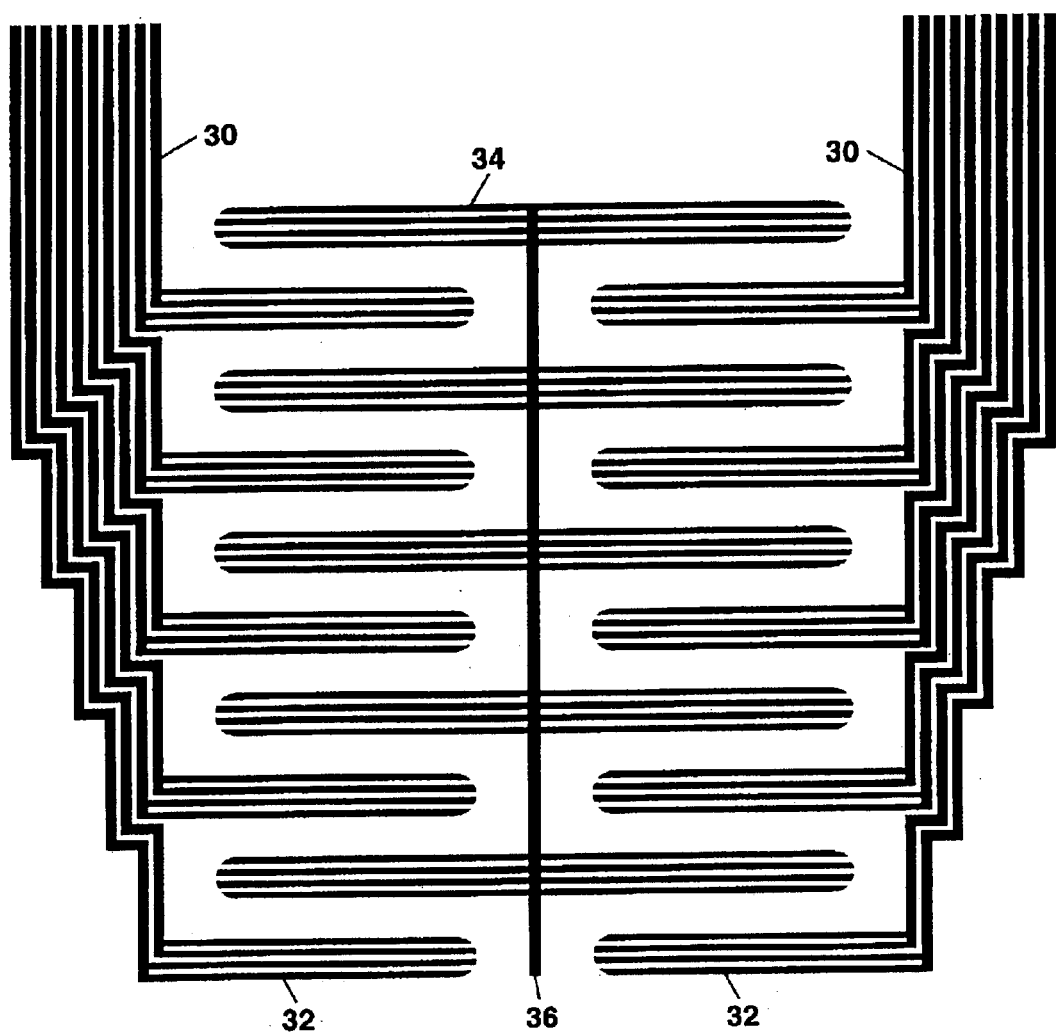
FIG. 3A is an enlarged view of a section of the coil of FIG. 3.

A second embodiment of the present invention is shown in FIGS. 3 and 3A. As with FIGS. 2 and 2A, for illustrative purposes, FIGS. 3 and 3A show many fewer conductors than exist in the actual coil. The coil of this embodiment has four capacitors in series, two above the active sample volume and two below. A coil with this configuration may be useful, for example, to excite and detect $^1H$ nuclei at 600.13 MHz in a 3-mm tube in a 14.1-Tesla magnet. A coil for detecting $^1H$ (sometimes referred to as a "proton" coil) is often the innermost coil in a probe, since proton detection is quite often considered the most important. Since the resonant frequency necessary for proton detection is significantly higher than that for almost all other isotopes, particular design constraints on the coil exist. Because the necessary resonant frequency is higher, the total capacitance may be lower. This, in turn, allows the use of more capacitors and, as shown in FIG. 3, the example coil has four capacitors in series.

The voltage of the coil is distributed among its capacitors. In the embodiment of FIG. 3, the use of four capacitors (as opposed to fewer) provides the option of making the overall voltage higher, since there are more capacitors to bear the load. With the higher overall voltage, a higher total current may correspondingly be produced, allowing a higher overall magnetic field intensity to be generated. Instead of, or in addition to, increasing a total voltage of the coil, one might take advantage of the spreading of the voltage across more capacitors by narrowing the gaps between fingers. With more capacitors, there is a lower voltage drop at each capacitor, so that the possibility of breakdown is decreased. By taking advantage of this fact by reducing the gaps between the capacitor elements, a better confinement of the electric field in the coil is achieved.

In the example shown in FIG. 3, the capacitors are located in the top and bottom of the coil. The capacitive fingers include those fingers 32 that extend from the vertical elements 30 of the coil. Also included are the center fingers 34 that extend between the fingers 32. The center fingers 34 are electrically connected to one another by conductor 36. This helps to ensure an equal voltage on each of the center fingers 34. As shown, the capacitor arrangements at the top and bottom of the coil are symmetrical about a horizontal axis passing through the center of the coil.

As is also shown in FIG. 3, the vertical elements are tapered inward at the top and bottom of the coil. That is, the vertical conductors 30 located closer to the center of the coil make contact with fingers 32 that are closer to the center of the coil, and therefore have a shorter overall length than the vertical elements to the outside. This allows the conductors further to the outside to be contoured inward around their inside neighbors, so that as one set of vertical elements terminates, the remaining vertical elements all shift inward together. This creates a stepwise tapering inward at the top and bottom of the coil. This is shown more clearly in FIG. 3A, which is an enlarged view of the region 38 of the coil that is identified in FIG. 3. Of course, since there are so many fewer conductors shown in this figure than would exist in an actual coil, there are as many fewer steps in each taper. However, the nature of the tapering will be evident to those skilled in the art. As shown, the inward shift of conductors at each step is far enough that the new innermost conductor of the group of vertical conductors resides at the horizontal position previously occupied by the last innermost vertical element. Thus, the inner edge of the group of conductors remains at the same horizontal position, while the outer edge is stepped inward.

As is also shown in FIG. 3A, each of the conductors is in contact with two of the adjacent horizontal fingerlets, and the fingerlets are arranged in groups of four. In this embodiment, each of the groups of four makes up one finger 32 of the capacitors, so that two vertical elements are electrically connected to each of the fingers 32. The center fingers 34 are likewise made up of four conductors each. In practice, each vertical element can connect to any integral number of fingers, or even to half a finger, as in this case. However, each finger is broken up into as many fingerlets as necessary to keep each individual fingerlet narrow enough that the shimmability of the magnet is not compromised. As is known in the art, an appropriate width to ensure good shimmability should be preferably less than or equal to twenty microns, although higher widths (e.g., 30 microns) may often prove satisfactory.

In this embodiment, connections between the vertical elements and the fingers are also made so that the total width of the fingers to which a single vertical element is connected is at least as great as the width of that vertical element itself. This ensures that the capacitor fingers do not limit the current that passes through the probe, i.e., that the capacitor fingers are not a "current bottleneck." Moreover, as in the other embodiments of the invention, the ends of the capacitor fingers are curved, so as to minimize the peak field strength and prevent electrostatic discharge. Preferably, the ends of the fingerlets are shaped in such a way that the end of each finger has an approximately semicircular shape.

The following are the possible parameters for a coil such as is shown in FIGS. 3 and 3A. The example coil could be a proton coil for a 600 MHz probe with 3-mm samples. The example coil has an outer coil width of 6,750 $\mu$m and an inner coil width of 2,830 $\mu$m. The outer length of is 34,000 $\mu$m and the inner length of 13,000 $\mu$m. The coil has 140 11-$\mu$m-wide vertical elements on each side, with each vertical element connected to one 11-$\mu$m-wide capacitor finger. In this example, the gaps between adjacent capacitor fingers are 26 $\mu$m. With these dimensions, it is not necessary to break the capacitor fingers into fingerlets (as is shown in the figures) and, as mentioned, each vertical element is connected to an entire capacitor finger.

Figure 4:
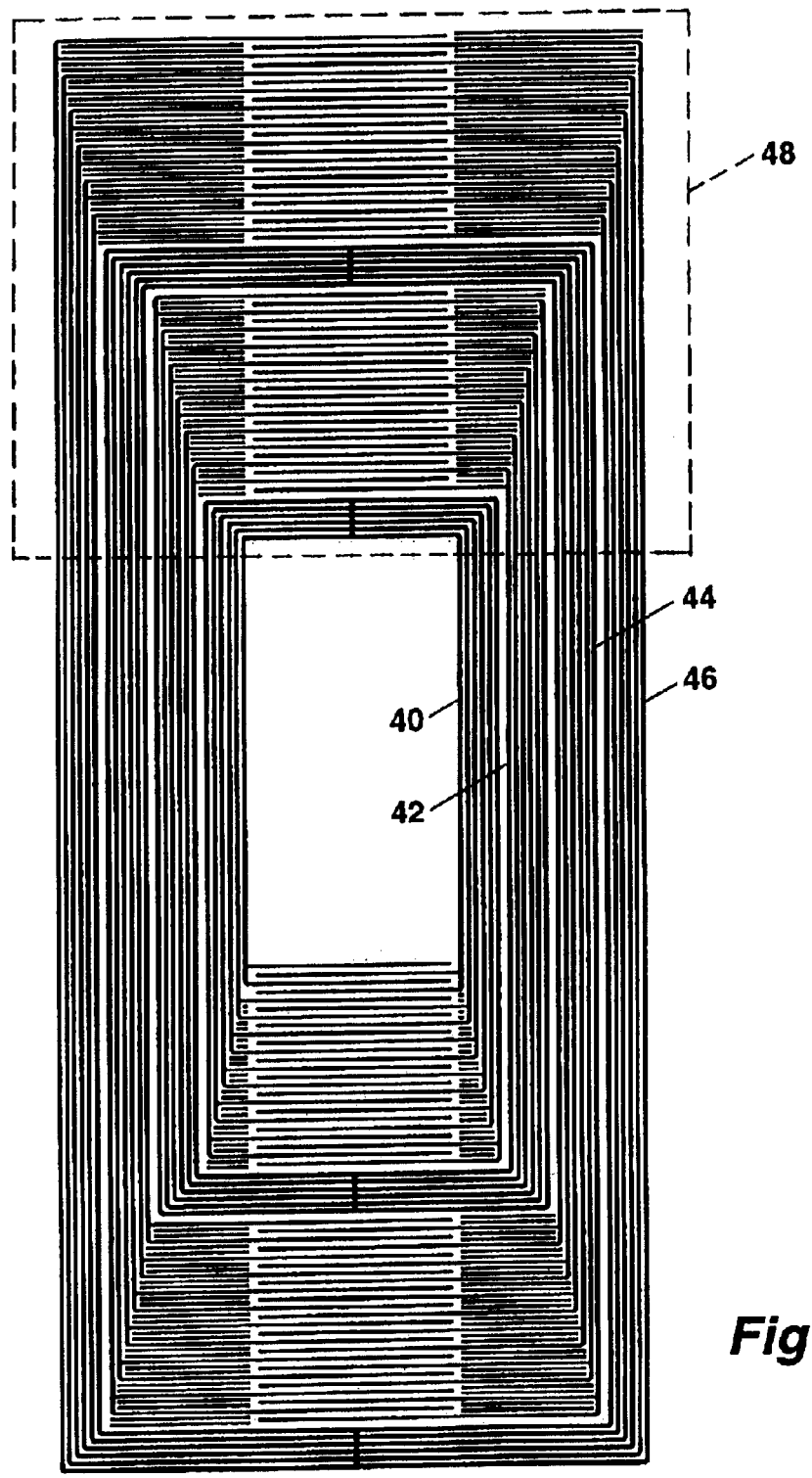
FIG. 4 is a schematic front view of the conductor distribution of a single capacitor superconducting coil for an NMR probe in which the coil has multiple nested sub-coils.

Another coil embodiment is shown in FIG. 4, and makes use of a coil nesting strategy to provide a single capacitor in a symmetric arrangement. In this particular embodiment, the coil is intended to excite and detect $^{13}$C nuclei at 125.76 MHz in a 0.8-mm inner-diameter capillary tube. Thus, although the frequency needed is the same as that required of the coil of FIG. 1, in this embodiment, there is a much smaller sample size. Therefore, the allowed substrate width is smaller, and even a two capacitor coil is not sufficient to provide the necessary low frequency signal. For this reason, the coil of FIG. 4 uses only a single capacitor. However, the capacitor is divided into four pieces, and the resulting "sub-coils" are concentrically nested. This nesting provides a good degree of symmetry to the coil, and results in the RF magnetic field being more homogeneous and perturbations to the static field being minimal. Moreover, undesirable fringing electric fields in the sample region are reduced.

The sub-coils of FIG. 4 are arranged so that each one has a capacitive section at either its top or bottom, relative to the orientation of the figure. The relative location of the capacitive section alternates from one sub-coil to the next, such that the innermost sub-coil 40 has a capacitive section on its bottom side, while the sub-coil 42 surrounding it has its capacitive section along its top side. Similarly, the outermost sub-coil 46 also has its capacitive section along its top side, while the sub-coil 44 it surrounds has its capacitive section along its bottom side. The construction of each sub-coil is the same, except that they differ in size. The symmetry of the coil nesting is such that the magnetic field generated within the coil is also symmetric. As shown, the capacitive portions of the sub-coils are all the same horizontal width, and each have the same number of capacitive fingers.

Figure 4A:
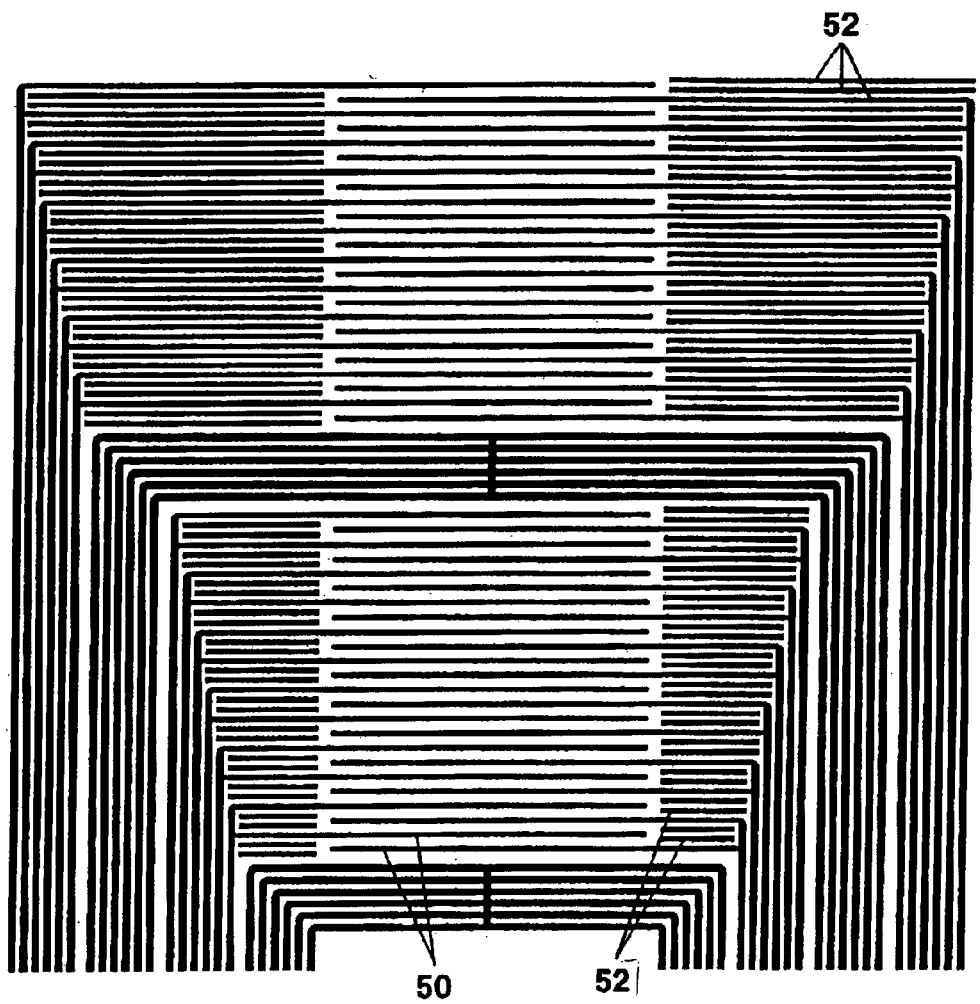
FIG. 4A is an enlarged view of a section of the coil of FIG. 4.

In the embodiment of FIG. 4, each vertical conductor is connected to two fingers of a capacitive portion. This allows the vertical elements of the sub-coils to be relatively wide, while allowing the necessary gaps between capacitive fingers. This is more clearly shown in FIG. 4A, which is an enlargement of the region 48 identified in FIG. 4. The capacitive region of each coil is defined by the overlap of the capacitor fingers 50. Thus, despite the fact that the fingers must extend horizontally outward in order to contact their respective vertical elements, the overlap region is the same width throughout the entire coil. As shown in FIG. 4A, conductive sections 52 are located within the spaces between fingers outside of the range of capacitive overlap. These sections are not in electrical contact with any other portion of the coil, and are therefore referred to as "islands." The conductive islands 52 of the coil provide RF magnetic field rejection in the empty regions between the fingers. As shown, the islands vary in length depending on the distance of a particular vertical element from the overlap region of the finger to which it is connected.

The following are the possible parameters for a coil such as is shown in FIGS. 4 and 4A. The example coil could be a carbon coil for a 600 MHz probe with 1-mm capillary samples. The coil has an outer width of 6,750 $\mu$m and an inner width of 3,990 $\mu$m. The outer length of is 25,000 $\mu$m and the inner length of 10,000 $\mu$m. The coil has ninety-two 12.5-$\mu$m-wide vertical elements on each side, twenty-three vertical elements on each side of each sub-coil. Each vertical element is connected to two 12.5-$\mu$m-wide capacitor fingers. In this example, the gaps between adjacent capacitor fingers are 24.5 $\mu$m.

Figure 5:
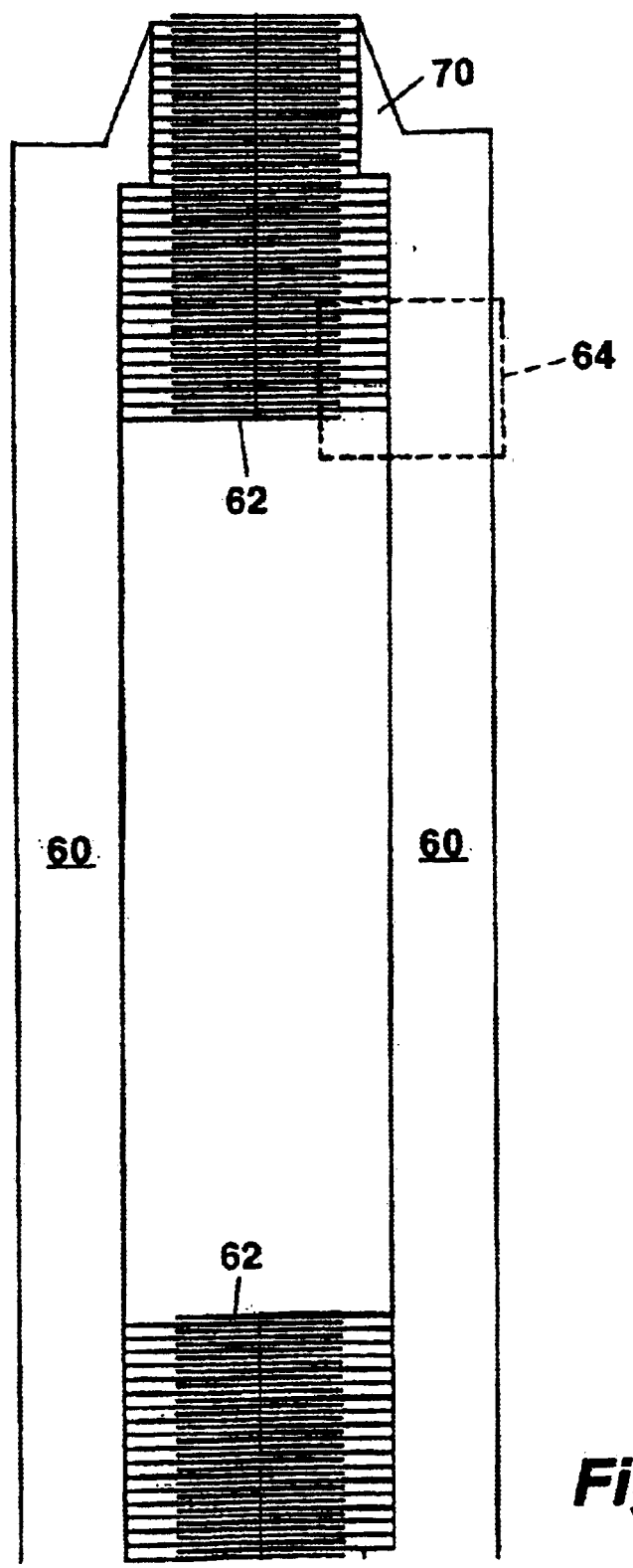
FIG. 5 is a schematic front view of the conductor distribution of a superconducting coil for an NMR probe in which the coil has a relatively long profile.

In FIG. 5 is shown another coil embodiment. For clarity, the vertical conductors of this coil, which are located in regions 60, are not explicitly shown in the figure due to their density. Those skilled in the art, however, will understand that the regions 60 contain parallel vertical elements that connect to the fingers of the capacitors 62. The coil of FIG. 5 is a two-capacitor coil, and would be appropriate, for example, for $^1$H excitation and detection with 3-mm samples in a 14.1-Tesla magnet. For each of the capacitors, only thirty finger pairs are needed to achieve the required capacitance. It should also be noted that the different coils are not necessarily to scale relative to each other but, rather, are drawn so as to make them as descriptive as possible. Therefore, for example, while it might appear from the figures that the two-capacitor coil of FIG. 5 might have more vertical conductors than the four-capacitor coil of FIG. 3, typically the opposite is true.

Figure 5A:
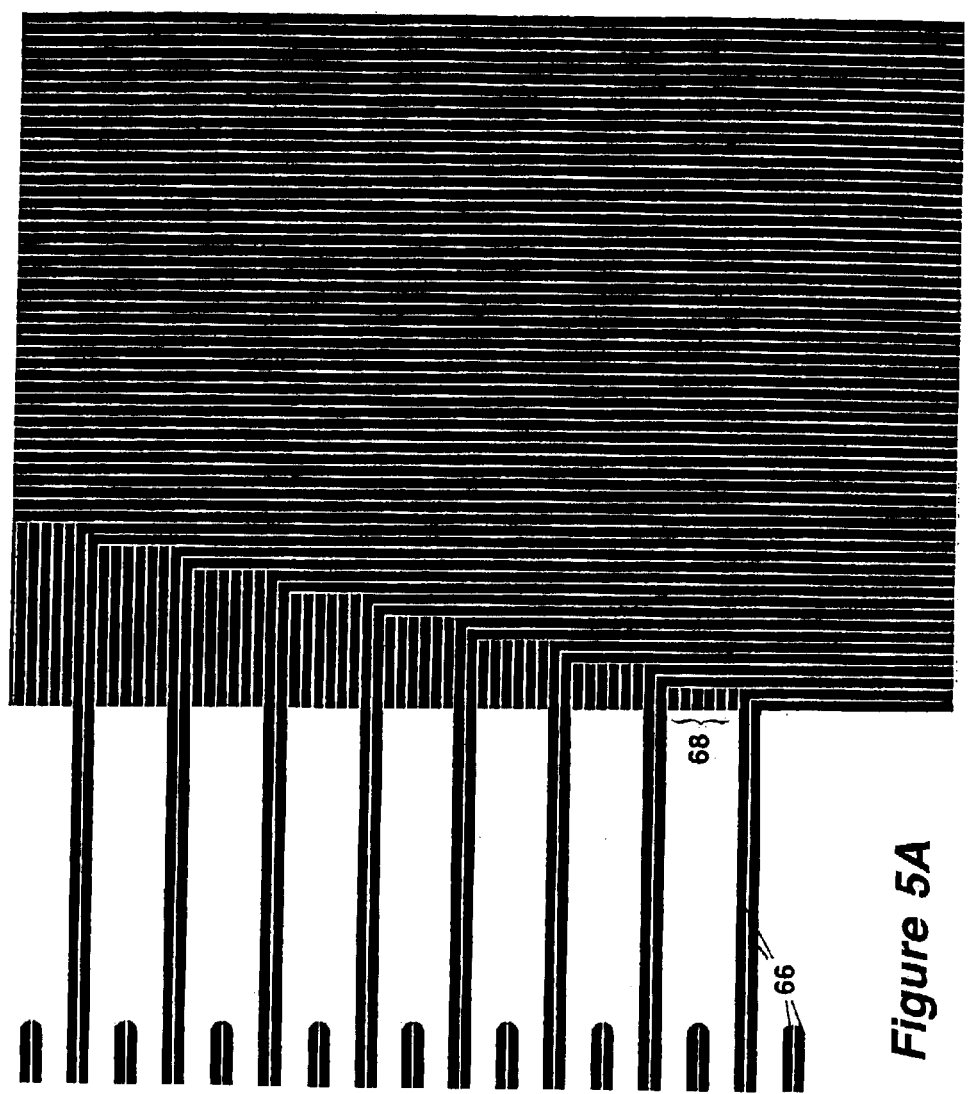
FIG. 5A is an enlarged view of a section of the coil of FIG. 5.

Depicted in FIG. 5A is an enlarged view of the area 64 identified in FIG. 5. Each finger is split into two 22 $\mu$m-wide fingerlets 66, each of which connects to one 22-$\mu$m-wide vertical elements. Progressively, toward the top and bottom of the coil, the vertical spaces left by the termination of the inner vertical elements are filled by conductive islands 68. The length of the islands is progressively longer toward the top and bottom of the coil, so that an inner vertical edge of conductive material is constant over much of the range of each capacitor 62. However, closer to the top and bottom of the coil, the vertical elements are tapered inward toward the fingerlets 66. The tapered regions 70, shown in FIG. 5, are tapered like the tapered regions of FIG. 3, with all of the vertical elements being stepped inward as each innermost conductor terminates at its respective fingerlet. For each capacitor, this tapering brings an inner vertical edge of conductive material closer to the fingerlets than in the section of the capacitor closer to the coil center. This keeps the vertical elements away from the edge of a wafer upon which the coil may be fabricated. Film quality often tends to be lower near such edges and, therefore, it is preferable to maintain a minimum distance of 1.5 mm from the wafer edge when providing a layout of the coils. The tapering of the coils of FIGS. 3 and 5 may allow more coils to be fabricated from a single wafer.

The following are the possible parameters for a coil such as is shown in FIGS. 5 and 5A. The example coil could be a proton coil for a 600 MHz probe with 3-mm capillary samples. The coil has an outer width of 6,750 $\mu$m and an inner width of 3,750 $\mu$m. The outer length of is 25,000 $\mu$m and the inner length of 13,000 $\mu$m. The coil has sixty 22-$\mu$m-wide vertical elements on each side, each connected to a 22-$\mu$m-wide fingerlet at the top of the coil and another 22-$\mu$m-wide fingerlet at the bottom of the coil. Each of these fingerlets, in turn, forms half of one capacitor finger. In this example, the gaps between adjacent capacitor fingers are 53 $\mu$m.

In each of the embodiments of the invention, the vertical elements running from the top to the bottom on both sides of the coil are straight and of uniform width. They are separated by only enough gap (a "gaplet") to suppress the magnetization of the superconducting film. For each coil having two or more capacitors, all vertical elements on each side of the coil may, at their midpoint, be connected by a common node. Similarly, a common node may be used to connect the conductors of each sub-coil in the nested single-capacitor coil of FIGS. 4 and 4A. Each of these nodes is connected to elements of the capacitors at the top and/or bottom of the coil. In most coils, especially those of lower resonant frequency, each vertical element will be connected to one or more of the alternating fingers of capacitors. However, in some coils, especially higher resonant frequency coils such as that of FIGS. 3 and 3A, each vertical element may be connected to only half on the fingerlets that make up one finger in a capacitor.

An alternative embodiment of the invention addresses a potential failure mode of coils like those of the present invention. The failures are a result of electrical discharge ("arcing") in the interdigital capacitors used in the coils. Because the coils are operated in a high vacuum, the nature of the arcing is field emission from the capacitor fingers. The electrons emitted in this process accelerate toward the opposing capacitor fingers and gain considerable energy, often on the order of one thousand electron volts. The accelerated electrons then impact the opposing electrode, causing considerable damage and the corresponding emission of material into the gap. The emitted material then ionizes in the electric field in the gap, creating a plasma and an even more energetic discharge. This can result in one or more of the fingers being severed from the capacitor which, in turn, causes the resonant frequency of the coil to rise, often to unusable frequencies.

Through observation, it has become apparent that these types of destructive discharges occur most often in the outermost finger pairs of the capacitors, as opposed to the innermost or central finger regions. This observation agrees with a theoretical analysis that indicates that more RF flux is coupled by the outer loops of the coils. Thus, more RF flux is coupled by the outermost fingers pairs of the capacitive structure than by the innermost pairs, and more RF voltage is therefore developed across the outermost capacitive fingers. This makes the electric field more intense at those outermost fingers, and makes the likelihood of discharge greater.

Figure 6A:
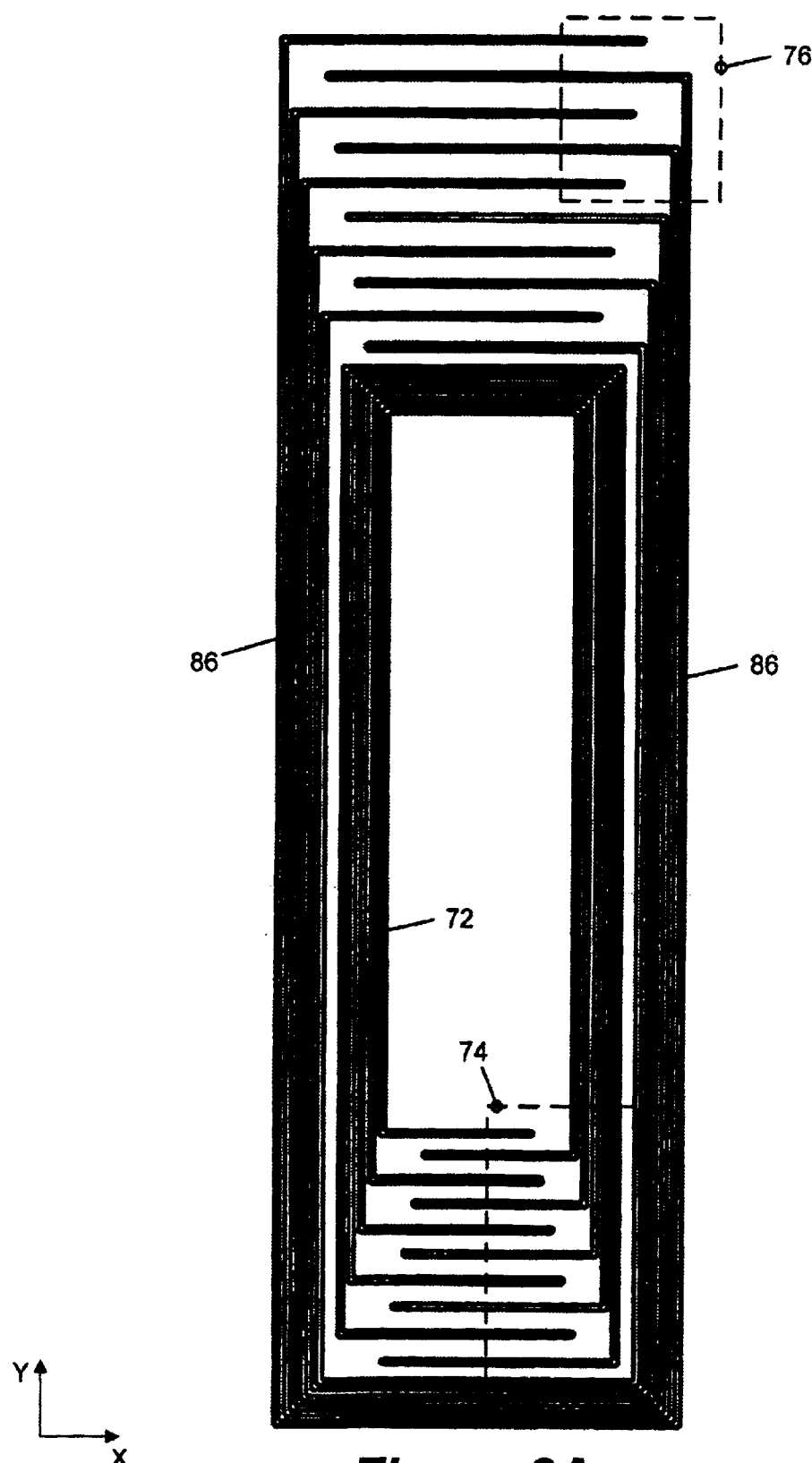
FIG. 6A is a schematic view of a coil in which the capacitor elements and the gaps between them have gaps that are graded across the length of the coil.
Figure 6C:
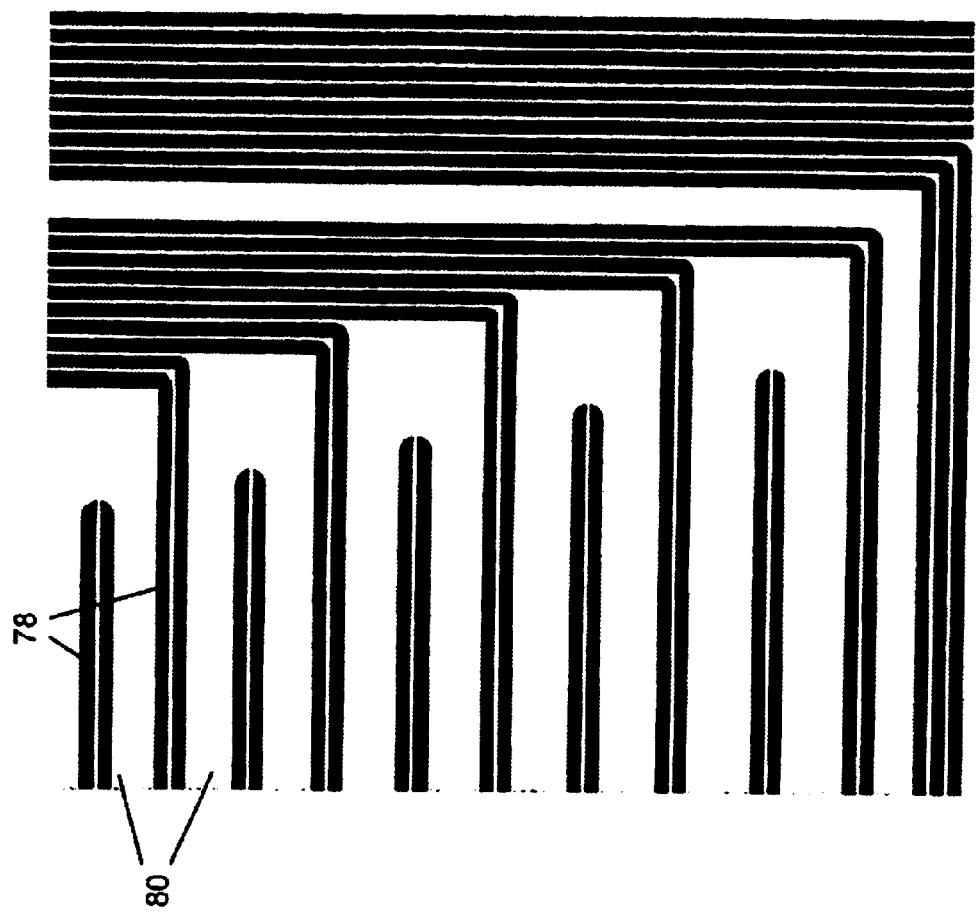
FIG. 6C is an enlarged view of a second section of the coil of FIG. 6A.
Figure 6B:
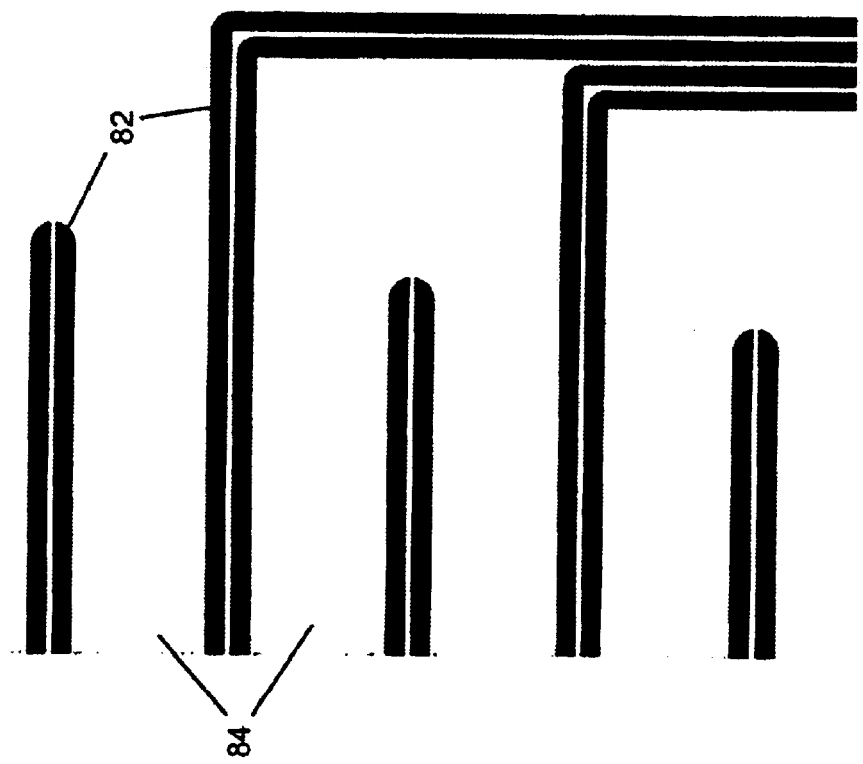
FIG. 6B is an enlarged view of a first section of the coil of FIG. 6A.

In the embodiment shown in FIG. 6A, the coil is arranged to compensate for the increased RF voltage that the outermost fingers experience. The coil is somewhat similar to that shown in FIG. 4, having a series of nested sub-coils, each with a set of capacitive fingers positioned so that they alternate top to bottom from one coil to the next. In FIG. 6A, the conductors have very small gaps between them and the separation between the capacitive fingers is clearly shown. For clarity, the conductors and capacitive fingers are shown in the figure with an exaggerated spacing, and only two nested coils are depicted, although those skilled in the art will recognize that more nested coils may be used. As is apparent, the fingers toward the inside of the coil are much narrower and closely spaced than the fingers toward the outside of the coil. This is demonstrated more clearly in the isolated views shown in FIGS. 6B and 6C. The view shown in FIG. 6B is an enlargement of the region 74 identified in FIG. 6A, and the view shown in FIG. 6C is an enlargement of the region 76 identified in FIG. 6A. As the degree of enlargement of each of the regions in FIGS. 6B and 6C is approximately the same, comparing these two figures makes clear the relative difference in size and separation.

The section shown in FIG. 6B, being toward the inside of the coil will experience significantly less RF flux than the section shown in FIG. 6C, which is to the outside of the coil. Thus, in FIG. 6B the capacitive fingers 78 are separated by gaps 80 that are relatively narrow. In contrast, the capacitive fingers 82 in the region of FIG. 6C will experience a much higher amount of RF flux, and are therefore separated by gaps 84 that are relatively wide. In this embodiment, it may be desirable to keep the average gap size (across the entire coil) equal to that of a comparable coil in which the gap size is constant. In addition, in the version of this embodiment that is shown, the widths of the fingers also vary depending on their location. In particular, the width of the fingers changes across the coil to match the changes in the gap widths. This is demonstrated in FIGS. 6B and 6C. In FIG. 6B, it can be seen that the finger widths relatively wide to match the width of the adjacent gaps. Similarly, in FIG. 6C, the finger widths are relatively narrow to match the width of the adjacent gaps. Thus, the coil has a uniform gap-to-width ratio, upon which the capacitance per unit length of a finger pair depends. This has the advantage that a graded-gap coil will have approximately the same resonant frequency as a non-graded coil with the same average gap. Although this is not a critical feature of the present invention, it may well be desired.

There are also different ways in which the size of the finger gaps and the fingers are themselves varied across the surface of the coil. The variation can be approximately monotonic, and may be a linear function. In the embodiment shown in FIGS. 6A–6C, there is a variation in the gap width of the fingers that is proportional to the position in the x-direction (as shown in the figure) of the current-carrying elements 86 (shown in FIG. 6A) to which the fingers are respectively connected. As shown, the width of a given capacitive finger is also proportional to the position in the x-direction of the current-carrying member to which it is connected. Another possible variation is to simply have the gap width (and optionally the finger width) vary so that it is proportional to position along the y-direction. Still another variation takes into account the amount of RF flux enclosed by a given set of capacitive fingers and the current-carrying elements to which they are connected. Tracing the conductive loop followed around the coil by a single set of capacitive fingers and connected current-carrying elements, calculation and/or experimentation can be used to determine the total amount of RF flux enclosed by that loop. The gap and, if desired, the finger widths for each set of fingers may then be made proportional to its corresponding enclosed RF flux. These arrangements may be used to achieve a nearly uniform average RF electric field in all the gaps of the coil. This recognizes the fact that in any given gap, the field is not necessarily uniform throughout that one gap. Thus, the "RF electric field" for each gap is the field averaged over that particular gap, and the goal is to make the averaged field uniform from gap to gap. It is foreseen that other position functions may be used to optimize the coil design, for example by numerical modeling or experimentation, and these are contemplated within the scope of the present invention. Moreover, those skilled in the art will recognize that a change in the width of the gaps and/or the width of the capacitive fingers may be applied to any of the other coil configurations disclosed herein.

Another method of preventing electrical discharge from the capacitive elements of the coil is to cover the coil with a high-quality dielectric material. A coil without such a cover is shown in FIGS. 7A and 7B. FIG. 7a is a side view of a coil having a dielectric substrate 88 on which is located the high-temperature superconductor coil layer 90. The substrate 88 is connected to a device mount 92 that is used to hold the coil in place. In the front view of FIG. 7B, the location of the coil 90 on the substrate 88 is apparent. To isolate the coil for the purposes of preventing electrical discharge, this embodiment of the invention makes use of a cover for the coil. The cover is a dielectric material like the substrate, and covers the superconducting coil layer. Such a configuration is shown in FIGS. 8A and 8B.

FIG. 8A is a side view of a coil with a dielectric cover. This figure is similar to FIG. 7A, but in addition to the substrate and device mount 92, a dielectric cover 94 is shown covering the coil region. In the enlarged portion of this figure, the cross section of this structure is shown. The coil 90 is attached to the surface of the substrate 88, and the dielectric cover 94 is fastened to the coil 90 by adhesive layer 96. Thus, the coil 90 is isolated between the dielectric substrate 88 and the dielectric cover 94. In this way, electrical discharge is minimized. FIG. 8B shows a front view of this arrangement, with cover 94 overlaying the region of the substrate 88 on which the coil 90 is located.

In this embodiment, a suitable dielectric material for the cover is the same material as is used for the substrate. For example, sapphire may be used as both a substrate material and a dielectric. Use the same material for both the substrate and the cover ensures a thermal expansion match between the two, and a dielectric breakdown field that is the same for both. A fluoropolymer film may be used as an adhesive 96 for fastening the cover 94 to the substrate 88. Although there may be a reduction in frequency due to the dielectric cover, the reduction is not significant. A few thermal cycles from room temperature to cryogenic temperature may be necessary for stabilization of this reduced frequency. Also, it may be possible to trim the coil through the cover using a laser in order to tune the coil to the desired frequency.

While the invention has been shown and described with reference to a preferred embodiment thereof, those skilled in the art will recognize that various changes in form and detail may be made herein without departing from the spirit and scope of the invention as defined by the appended claims. For example, the invention is equally applicable to low temperature superconductors and, with some modifications, to normal metal conductors at room or low temperature. While low temperature superconductor coils do not offer the advantages of operating temperatures above 20K, they are capable of achieving an extremely high Q. Normal metal coils do not achieve the high Qs of superconductor coils, but may benefit from application of certain aspects of the invention, and are at least minimally functional. It will also be appreciated that the coil design may be optimized for filling factor, depending upon the size and shape of the sample, and may be designed for any desired resonant frequency. Further, it will be appreciated that the invention is useful for NMR spectroscopy and microscopy and for magnetic resonance imaging.

What is claimed is:

1. A magnetic resonance radio frequency resonator that generates a radio frequency magnetic field in an active sample volume, the magnetic resonance radio frequency resonator comprising:
   a two-dimensional dielectric substrate;
   a conductive material deposited on the dielectric substrate and forming a plurality of nested current carrying loops each of which has magnetic field generating elements and interdigital capacitor elements, the current carrying loops forming a substantially closed geometric path surrounding an inner region that lies adjacent to the active sample volume, wherein the interdigital capacitive elements are substantially parallel to one another and wherein interdigital capacitor elements located close to the inner region are separated from one another by non-conducting gaps that are narrower than non-conducting gaps that separate interdigital capacitor elements located further from the inner region.

2. A magnetic resonance radio frequency resonator according to claim 1 wherein the conductive material is a superconductor.

3. A magnetic resonance radio frequency resonator according to claim 2 wherein the superconductor is a high temperature superconductor.

4. A magnetic resonance radio frequency resonator according to claim 1 wherein the inner region has a substantially oblong shape and the magnetic field generating elements comprise electrical conductors that run substantially parallel to a major axis of the oblong shape.

5. A magnetic resonance radio frequency resonator according to claim 4 wherein the interdigital capacitor elements comprise electrical conductors that run substantially perpendicular to said major axis of the oblong shape.

6. A magnetic resonance radio frequency resonator according to claim 5 wherein the non-conducting gaps also extend in a direction perpendicular to said major axis.

7. A magnetic resonance radio frequency resonator according to claim 4 wherein the respective lengths of the magnetic field generating elements vary relative to their distance from a center of the oblong shape.

8. A magnetic resonance radio frequency resonator according to claim 7 wherein the respective lengths of the interdigital capacitor elements vary relative to their distance from a center of the oblong shape.

9. A magnetic resonance radio frequency resonator according to claim 7 wherein, together, the magnetic field generating elements occupy a space having a substantially trapezoidal shape.

10. A magnetic resonance radio frequency resonator according to claim 1 wherein the interdigital capacitor elements together make up a plurality of capacitors connected in series with the magnetic field generating elements.

11. A magnetic resonance radio frequency resonator according to claim 1 wherein the resonator comprises a plurality of conductive sub-coils, each of which incorporates a plurality of said magnetic field generating elements and said interdigital capacitor elements.

12. A magnetic resonance radio frequency resonator according to claim 11 wherein the capacitor elements of a first sub-coil are located to an opposite side of the inner region from the capacitor elements of any sub-coil immediately adjacent to the first sub-coil.

13. A magnetic resonance radio frequency resonator according to claim 1 wherein the size of the gaps from an innermost interdigital capacitor, closest to the inner region, to an outermost interdigital capacitor element, furthest from the inner region, varies according to a particular function.

14. A magnetic resonance radio frequency resonator according to claim 13 wherein said function is monotonic.

15. A magnetic resonance radio frequency resonator according to claim 14 wherein said function is linear.

16. A magnetic resonance radio frequency resonator according to claim 1 wherein interdigital capacitor elements close to the inner region are narrower than interdigital capacitor elements further from the inner region.

17. A magnetic resonance radio frequency resonator according to claim 16 wherein the width of the interdigital capacitor elements from an innermost interdigital capacitor element, closest to the inner region, to an outermost interdigital capacitor element, furthest from the inner region, varies according to a particular function.

18. A magnetic resonance radio frequency resonator according to claim 17 wherein said function is monotonic.

19. A magnetic resonance radio frequency resonator according to claim 18 wherein said function is linear.

20. A magnetic resonance radio frequency resonator according to claim 1 wherein an average RF electric field is approximately equal for each of the gaps between the interdigital capacitor elements.

21. A resonant magnetic field coil for an NMR spectrometer that generates a radio frequency magnetic field in an active sample volume, the coil comprising:
a planar dielectric substrate;
a high-temperature superconductor material deposited on the dielectric substrate and forming a plurality of nested current carrying loops each of which has magnetic field generating elements and interdigital capacitor elements, the current carrying loops forming a substantially closed geometric path surrounding an inner region that has a substantially oblong shape and lies adjacent to the active sample volume, wherein the magnetic field generating elements comprise electrical conductors that run substantially parallel to a major axis of the oblong shape and the interdigital capacitor elements comprise electrical conductors that run substantially perpendicular to said major axis of the oblong shape, the interdigital capacitor elements being wider the further they are from the inner region and being separated by gaps that are wider the further they are from the inner region.

22. A method of constructing a magnetic resonance radio frequency resonator that generates a radio frequency magnetic field in an active sample volume, the method comprising:
providing a planar dielectric substrate;
depositing a conductive material on the dielectric substrate to form a plurality of nested current carrying loops each of which has magnetic field generating elements and interdigital capacitor elements, the current carrying loops forming a substantially closed geometric path surrounding an inner region that has a substantially oblong shape and lies adjacent to the active sample volume, wherein the interdigital capacitive elements are substantially parallel to one another and wherein interdigital capacitor elements located close to the inner region are separated from one another by non-conducting gaps that are narrower than non-conducting gaps that separate interdigital capacitor elements located further from the inner region.

23. A method according to claim 22 wherein the conductive material is a superconductor.

24. A method according to claim 23 wherein the superconductor is a high temperature superconductor.

25. A method according to claim 22 wherein the magnetic field generating elements comprise electrical conductors that run substantially parallel to a major axis of the oblong shape.

26. A method according to claim 25 wherein the interdigital capacitor elements comprise electrical conductors that run substantially perpendicular to said major axis of the oblong shape.

27. A method according to claim 25 wherein the respective lengths of the magnetic field generating elements vary relative to their distance from a center of the oblong shape.

28. A method according to claim 22 wherein the resonator comprises a plurality of conductive sub-coils, each of which incorporates a plurality of said magnetic field generating elements and said interdigital capacitor elements, and wherein the capacitor elements are located to both sides of the oblong shape relative to a major axis of the oblong shape.

29. A method according to claim 22 wherein the size of the gaps from an innermost interdigital capacitor, closest to the inner region, to an outermost interdigital capacitor element, furthest from the inner region, varies according to a particular function.

30. A method according to claim 29 wherein said function is monotonic.

31. A method according to claim 30 wherein said function is linear.

32. A method according to claim 22 wherein interdigital capacitor elements close to the inner region are wider than interdigital capacitor elements further from the inner region.

33. A method according to claim 32 wherein the width of the interdigital capacitor elements from an innermost interdigital capacitor element, closest to the inner region, to an outermost interdigital capacitor element, furthest from the inner region, varies according to a particular function.

34. A method according to claim 33 wherein said function is monotonic.

35. A method according to claim 34 wherein said function is linear.

36. A method according to claim 22 wherein an average RF electric field charge is approximately equal for each of the gaps between the interdigital capacitor elements.

* * * * *